US007733306B2

(12) United States Patent
Yoon

(10) Patent No.: US 7,733,306 B2
(45) Date of Patent: Jun. 8, 2010

(54) SRAM CORE CELL FOR LIGHT-EMITTING DISPLAY

(75) Inventor: Han-Hee Yoon, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 902 days.

(21) Appl. No.: 11/132,119

(22) Filed: May 17, 2005

(65) Prior Publication Data

US 2005/0262293 A1 Nov. 24, 2005

(30) Foreign Application Priority Data

May 24, 2004 (KR) .................... 10-2004-0036868

(51) Int. Cl.
*G09G 3/30* (2006.01)
(52) U.S. Cl. .......................... 345/76; 345/55
(58) Field of Classification Search .................. 345/76, 345/55, 45, 36, 160, 156; 257/393, 903; 315/169.3
See application file for complete search history.

(56) References Cited

U.S. PATENT DOCUMENTS

| 4,688,030 | A |   | 8/1987  | Uemura et al. |
|-----------|---|---|---------|---------------|
| 5,526,303 | A |   | 6/1996  | Okajima       |
| 5,909,047 | A |   | 6/1999  | Takahashi     |
| 6,072,714 | A | * | 6/2000  | Deguchi ................ 365/154 |
| 6,160,298 | A | * | 12/2000 | Ohkubo ................ 257/393 |
| 2003/0025217 | A1 | * | 2/2003 | Song ................ 257/903 |
| 2004/0084702 | A1 | * | 5/2004 | Jeong ................ 257/295 |

FOREIGN PATENT DOCUMENTS

| CN | 1485926 A  | 3/2004  |
|----|------------|---------|
| JP | 06-224391  | 8/1994  |
| JP | 8-37241    | 2/1996  |
| JP | 9-321152   | 12/1997 |
| JP | 10-209300  | 7/1998  |

(Continued)

OTHER PUBLICATIONS

European Search Report dated Apr. 15, 2008, for corresponding European application 05104144.0, indicating relevance of references listed in this IDS.

(Continued)

*Primary Examiner*—Amare Mengistu
*Assistant Examiner*—Insa Sadio
(74) *Attorney, Agent, or Firm*—Christie, Parker & Hale, LLP

(57) ABSTRACT

A SRAM core cell for a light-emitting display applicable to a data driver of an organic electro-luminescence light-emitting display device includes thin film transistors as a data memory for a data driver of the light-emitting display. The SRAM core cell also includes switching transistors and data memory transistors. The switching transistors are coupled to a bit line and a word line to select data writing or reading. The data memory transistors are coupled to a power voltage or a ground voltage to enable data writing and reading. The bit line and the word line are formed in first and second directions. The channels of the switching transistors and the data memory transistors are formed in an oblique direction with respect to the first and second directions.

12 Claims, 7 Drawing Sheets

FOREIGN PATENT DOCUMENTS

| | | |
|---|---|---|
| JP | 10-335487 | 12/1998 |
| JP | 11-145310 | 5/1999 |
| JP | 2004-104128 | 4/2004 |
| KR | 1998-029026 | 7/1998 |
| KR | 2001-0003628 | 1/2001 |

OTHER PUBLICATIONS

Patent abstract of Japan for publication No. 08-037241 dated Feb. 6, 1996 in the name of Tsutomu Ichikawa.

Patent abstract of Japan for publication No. 09-321152 dated Dec. 12, 1997 in the name of Hisashi Takahashi.

Patent abstract of Japan for publication No. 10-209300 dated Jul. 8, 1998 in the name of Tsutomu Ichikawa.

Korean patent abstract for publication No. 1019980029026 dated Jul. 15, 1998 in the name of LG Semicon Co., Ltd.

Korean patent abstract for publication No. 1020010003628A dated Jan. 15, 2001 in the name of Dae Hui Han, et al.

Patent Abstracts of Japan, Publication No. 06-224391, dated Aug. 12, 2004, in the name of Kitakata Makoto.

Patent Abstracts of Japan, Publication No. 2004-104128, dated Apr. 2, 2004, in the name of Go Shoho et al.

* cited by examiner

SRAM CORE CELL FOR LIGHT-EMITTING DISPLAY

CROSS REFERENCE TO RELATED APPLICATION

This application claims priority to and the benefit of Korean Patent Application No. 10-2004-0036868 filed on May 24, 2004 in the Korean Intellectual Property Office, the entire content of which is incorporated herein by reference.

BACKGROUND OF THE INVENTION (a) Field of the Invention

The present invention relates to a static RAM (SRAM) core cell. More specifically, the present invention relates to a SRAM core cell for a light-emitting display, and is applicable to a data driver of an organic electro-luminescence (EL) light-emitting display device.

(b) Description of the Related Art

The organic EL light-emitting display is a device for displaying an image by controlling a current flowing to an organic material that emits light when the current flows to it. In the organic EL light-emitting display, the organic material is divided by pixels and arranged in a matrix form. The organic EL light-emitting display is promising as a next-generation display device because of its advantages such as low-voltage driving requirement, light weight, slim design, wide viewing angle, rapid response, etc.

FIG. 1 illustrates the principle of light emission of a typical organic EL.

In general, an organic EL light-emitting display, which is a display device that electrically excites a fluorescent organic compound to emit light, drives N×M organic light-emitting cells by voltage or current to represent an image. The organic light-emitting cell has a structure of FIG. 1 that includes an ITO (Indium Tin Oxide) pixel electrode, an organic thin film, and a metal layer. The organic thin film is a multi-layer structure that includes a light-emitting layer (EML), an electron transport layer (ETL), and a hole transport layer (HTL) to keep electrons and holes in good balance and enhance the light-emitting efficiency. The organic thin film may also include an electron injecting layer (EIL) and a hole injecting layer (HIL).

There are typically two driving methods for the organic light-emitting cells: the passive matrix method and the active matrix method using TFTs. The passive matrix method involves selectively driving anode and cathode lines arranged orthogonally to each other, while the active matrix method involves coupling TFTs and capacitors to the respective pixel electrodes and sustaining a voltage according to a capacitor capacity.

FIG. 2 is a schematic block diagram of a typical organic EL display device.

Referring to FIG. 2, the organic EL display device includes a video controller 210, a panel controller 220, a power module 230, a scan driver 240, a data driver 250, and an organic EL panel 260. The scan driver 240 and the data driver 250 supply various signals to the organic EL panel 260 in the column and row directions via analog and digital interfaces, respectively.

More specifically, various analog signals such as R, G, and B signals and sync signals are fed into the video controller 210 and converted into digital signals. The panel controller 220 controls the converted digital signals and supplies them to the scan driver 240 and the data driver 250 in sequence. The organic EL panel 260 drives N×M organic light-emitting cells by voltage or current using the signals supplied from the scan driver 240 and the data driver 250, and the power supplied from the power module 230 to represent an image.

FIG. 3 shows a general active matrix organic EL display panel using TFTs.

Referring to FIG. 3, the organic EL display device includes an organic EL display panel 310, a data driver 320, and a scan driver 330.

The organic EL display panel 310 includes m data lines D1, D2, ..., Dm arranged in columns; n scan lines S1, S2, ..., Sn arranged in rows; and n×m pixel circuits. The m data lines D1, D2, ..., Dm transfer data signals representing image signals to the pixel circuits, and the n scan lines S1, S2, ..., Sn transfer selection signals to the pixel circuits. Each pixel circuit is formed in one pixel area 310-1 defined by two adjacent ones of the m data lines D1, D2, ..., Dm, and two adjacent ones of the n scan lines S1, S2, ..., Sn. The pixel circuit includes, for example, transistors 311 and 312, a capacitor 313, and an organic EL diode 314. Here, reference numeral 315 denotes a power voltage Vdd.

More specifically, each pixel circuit 310-1 includes the organic EL diode (OLED) 314, two transistors 311 and 312, and the capacitor 313. For example, the two transistors 311 and 312 may be PMOS transistors.

The driving transistor 312 has its source coupled to the power voltage $V_{dd}$, and the capacitor 313 coupled between its gate and source. The capacitor 313 sustains the gate-source voltage of the driving transistor 312 for a predetermined time period, and the switching transistor 311 transfers a data voltage from the data line Dm to the driving transistor 312 in response to the selection signal from the current scan line Sn.

The organic EL diode 314 has its cathode coupled to a reference voltage $V_{ss}$, and emits a light corresponding to a current applied through the driving transistor 312. Here, the power $V_{ss}$ coupled to the cathode of the organic EL diode 314 is lower than the power $V_{dd}$ and can be a ground voltage.

The scan driver 330 sequentially applies the selection signal to the n scan lines S1, S2, ..., Sn, while the data driver 320 sequentially applies a data voltage corresponding to the image signal to the m data lines D1, D2, ..., Dm.

The scan driver 330 and/or the data driver 320 may be coupled to the organic EL display panel 310, or mounted as a chip in a tape carrier package (TCP) soldered and coupled to the organic EL display panel 310. Alternatively, the scan driver 330 and/or the data driver 320 may be mounted as a chip in a flexible printed circuit (FPC) or a film soldered and coupled to the display panel 310.

Moreover, the scan driver 330 and/or the data driver 320 may be directly mounted on a glass substrate of the organic EL display panel 310, or substituted by driver circuitry including the same layers of the scan lines, the data lines, and the TFTs on the glass substrate.

FIG. 4 is a circuit diagram of a CMOS SRAM core cell according to prior art.

The CMOS SRAM core cell according to prior art is used with the data driver 320 to implement the organic EL display device as an SOP (System On Package), and is designed as a SRAM having six TFTs. The SRAM stores the data to be displayed on the organic EL panel 260.

Referring to FIG. 4, symbols "MP1" and "MP2" denote pull-up transistors, symbols "MN1" and "MN2" denote pull-down transistors, and symbols "MP3" and "MP4" denote pass transistors for a data access. Here, MP1 to MP4 are PMOS transistors, and MN1 and MN2 are NMOS transistors. The MP1 and the MN1, and the MP2 and the MN2 are implemented as CMOS transistors and arranged in a latch configuration.

In the CMOS RAM core cell according to prior art, a plurality of NMOS and PMOS transistors must be formed with a predetermined width and a predetermined length, with a restriction on a design of the layout, allowing no flexibility of design and causing defects in the fabrication process.

SUMMARY OF THE INVENTION

In one embodiment, the present invention is a SRAM core cell for a light-emitting display that has an enhanced integration level of a defined layout space by forming the gate channel of a thin film transistor (TFT) constituting the SRAM core cell in an oblique direction.

In one embodiment, the present invention is a SRAM core cell for a light-emitting display that secures a process margin to prevent defects in the fabrication process by enhancing the efficiency of a defined layout space.

In one aspect of the present invention, there is provided a static RAM (SRAM) core cell for a light-emitting display includes a plurality of thin film transistors each having a gate, a source, and a drain as a data memory for a data driver of the light-emitting display. The SRAM core cell includes switching transistors and data memory transistors. The switching transistors are coupled to a bit line and a word line so as to select writing or reading of data. The data memory transistors are coupled to a power voltage (Vdd) or a ground voltage (Vss) so as to enable writing and reading of data. The bit line and the word line are formed in first and second directions, respectively. The channels of the switching transistors and the data memory transistors are formed in an oblique direction with respect to the first and second directions, respectively.

Here, the oblique direction is a clockwise direction or a counterclockwise direction with respect to the first or second direction.

The switching transistors or the data memory transistors arranged in an oblique direction include a polysilicon layer deposited in an oblique direction on a substrate.

In another aspect of the present invention, a SRAM core cell includes six thin film transistors each having a gate, a source, and a drain. The SRAM core cell includes a first switching transistor, a second switching transistor, and first to fourth data memory transistors. The first switching transistor has a gate coupled to a word line, and a source/drain coupled to a first bit line to select an input to the first bit line according to an input signal to the word line. The second switching transistor has a gate coupled to the word line, and a source/drain coupled to a second bit line to select an input to the second bit line according to an input signal to the word line. The first to fourth data memory transistors are coupled to a power voltage or a ground voltage to enable writing or reading of data under the control of the first and second switching transistors. The bit lines and the word line are formed in first and second directions, respectively. The channels of the first and second switching transistors and the first to fourth data memory transistors are formed in an oblique direction with respect to the first and second directions, respectively.

Here, the first and second switching transistors and the first to fourth data memory transistors are arranged in sequence on a layout space of a predetermined area.

In still another aspect of the present invention, a semiconductor device includes a substrate and a plurality of transistors each having a gate and a source/drain formed on an active region deposited on the substrate. The channels of the transistors formed on the active region are formed in an oblique direction with respect to a layout width or length direction on a layout space of a predetermined area.

Here, the oblique direction is a clockwise direction or a counterclockwise direction with respect to the layout width or length direction.

The channels of the transistors formed on the active region and arranged in an oblique direction are preferably arranged in sequence. The transistors arranged in an oblique direction on the active region include a polysilicon layer deposited in an oblique direction with respect to a vertical direction on the substrate.

In one embodiment, the present invention arranges transistors in sequence so as to form a polysilicon layer or channels forming the transistors in an oblique direction in a defined region in designing a SRAM for a data driver of a light-emitting display, thereby enhancing the layout efficiency of the core cell and implementing a light-emitting display device of a high integration level.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION

Hereinafter, a SRAM core cell for a light-emitting display according to an embodiment of the present invention will be described in detail with reference to the accompanying drawings.

Figure 1:
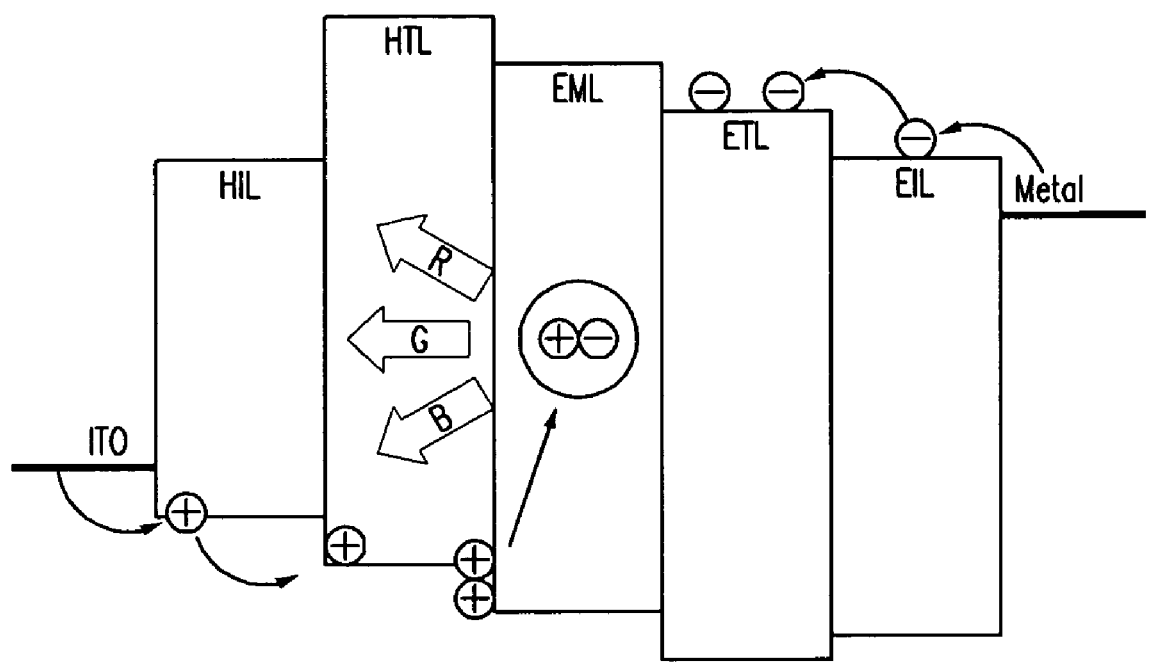
FIG. 1 illustrates the principle of light emission of an organic EL display device.
Figure 2:
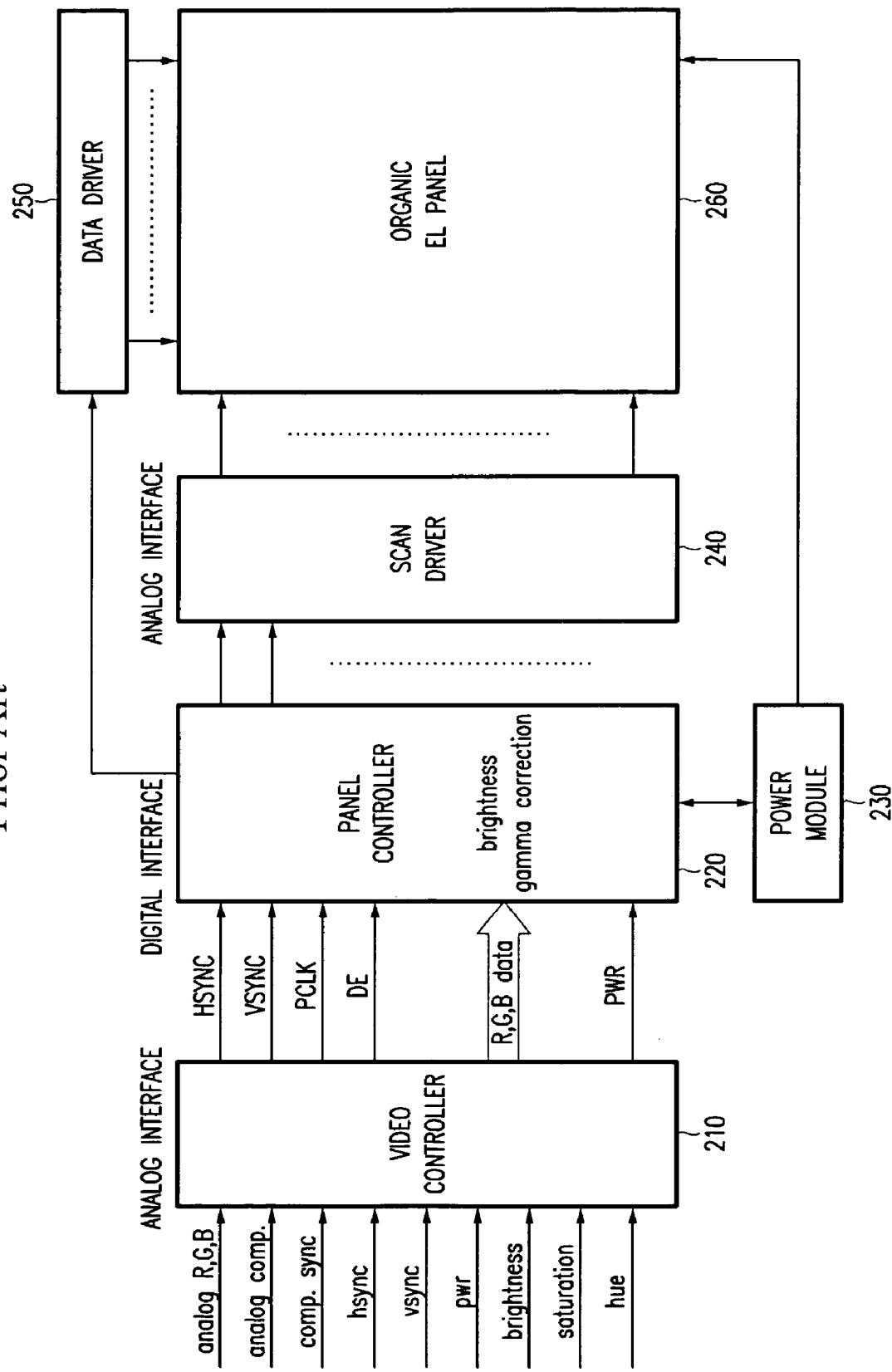
FIG. 2 is a schematic block diagram of an organic EL display device.
Figure 3:
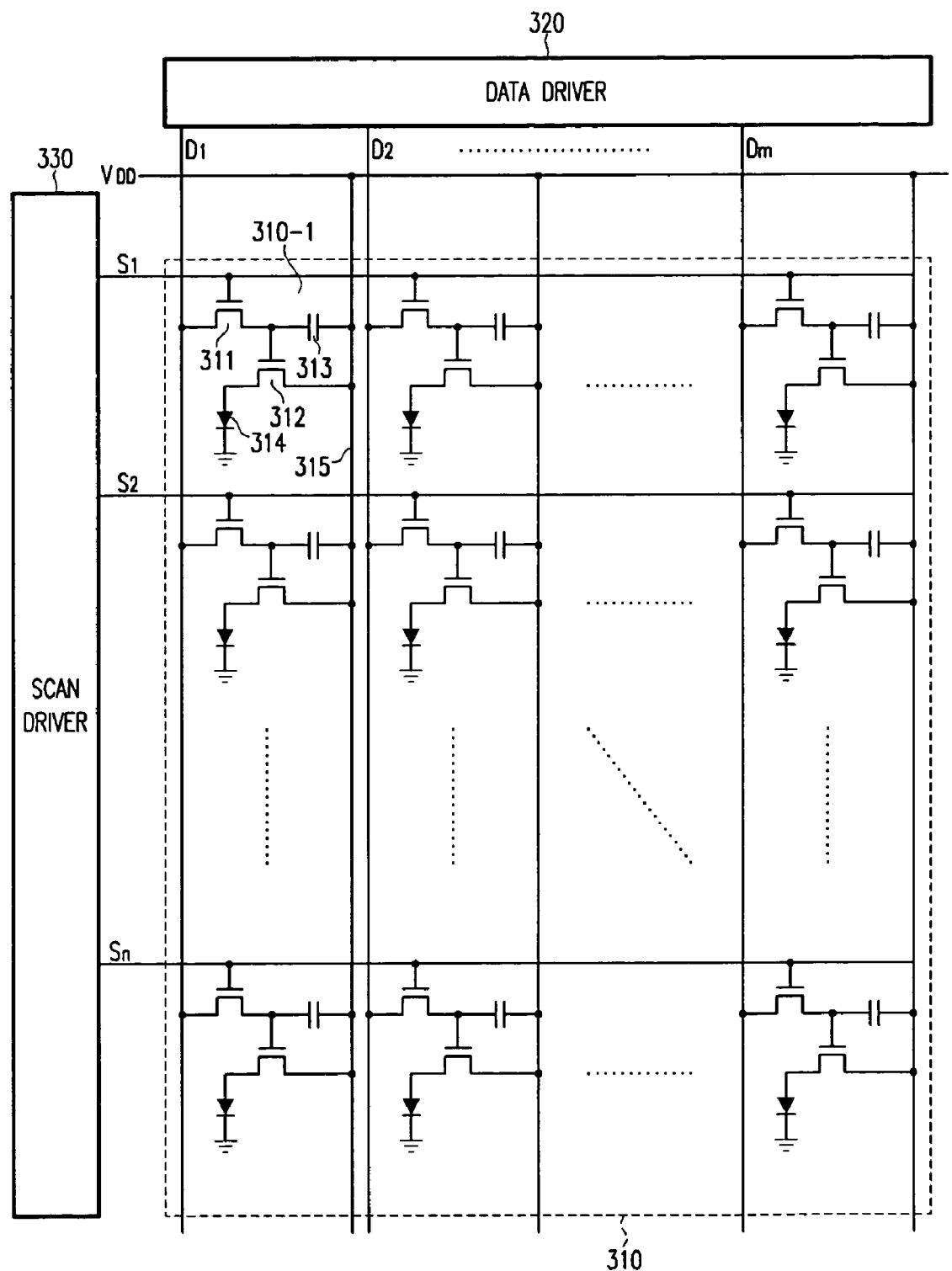
FIG. 3 shows a general active matrix organic EL display panel using TFTs.
Figure 4:
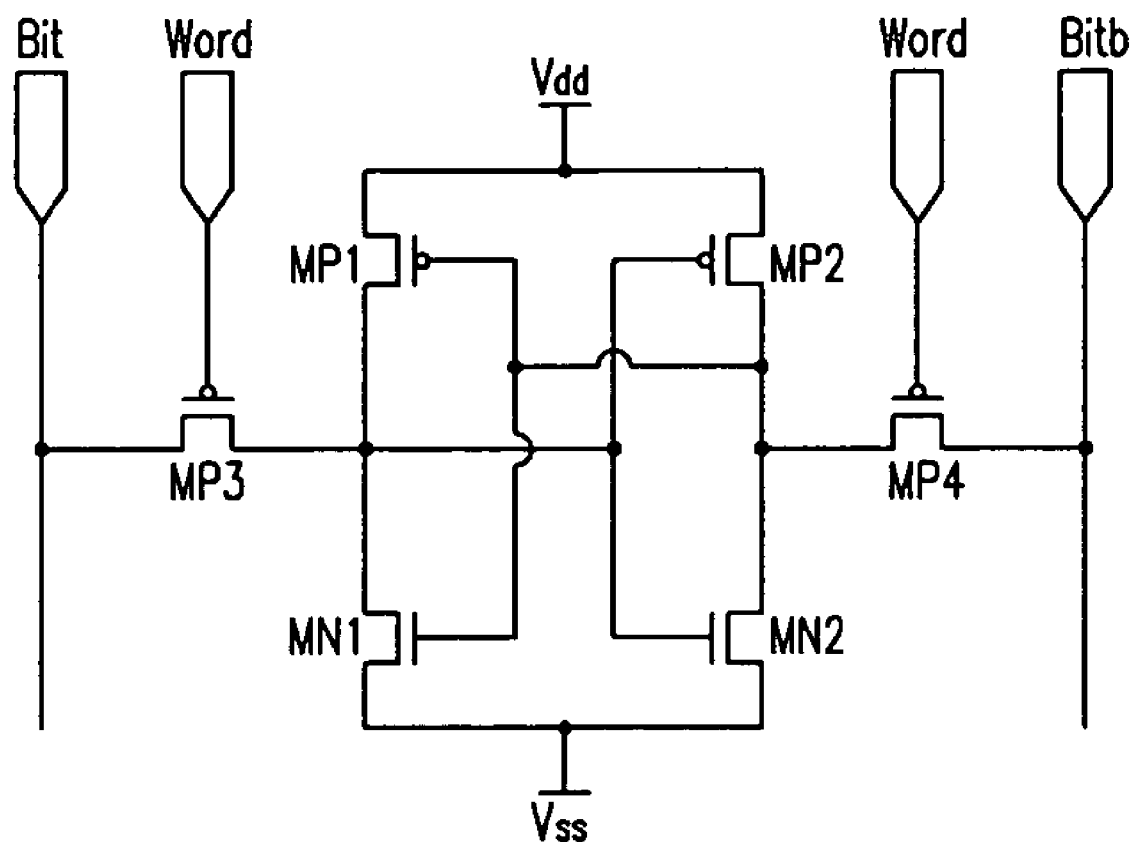
FIG. 4 is a circuit diagram of a CMOS SRAM core cell for an EL display device.

Referring to FIG. 4, a SRAM core cell includes two flip-flop circuits for memory (e.g., MP1 and MN1, and MP2 and MN2), and two switches (e.g., MP3 and MP4). By applying pulses to word lines to turn a cell transistor on, data transfer is activated between a bit line pair ("Bit" and "Bitb") and flip-flops. When writing data, a high voltage is applied to one side of the bit line pair, a low voltage being applied to the other side. This is transferred to a memory node (a common source/drain node of MP1 and NM1, and a common source/drain node of MP2 and MN2) to memorize binary information. When reading data, a voltage sustained at the bit line pair is detected in correspondence to the voltage of nodes and transferred to the exterior. Unlike the DRAM, the SRAM stores data without a refresh operation, i.e., statically by the flip-flop feedback, as long as the power is on. However, the SRAM is relatively expensive because a large number of elements are used to construct one cell, with a memory capacity being about ¼ of the DRAM with the same area.

Figure 5:
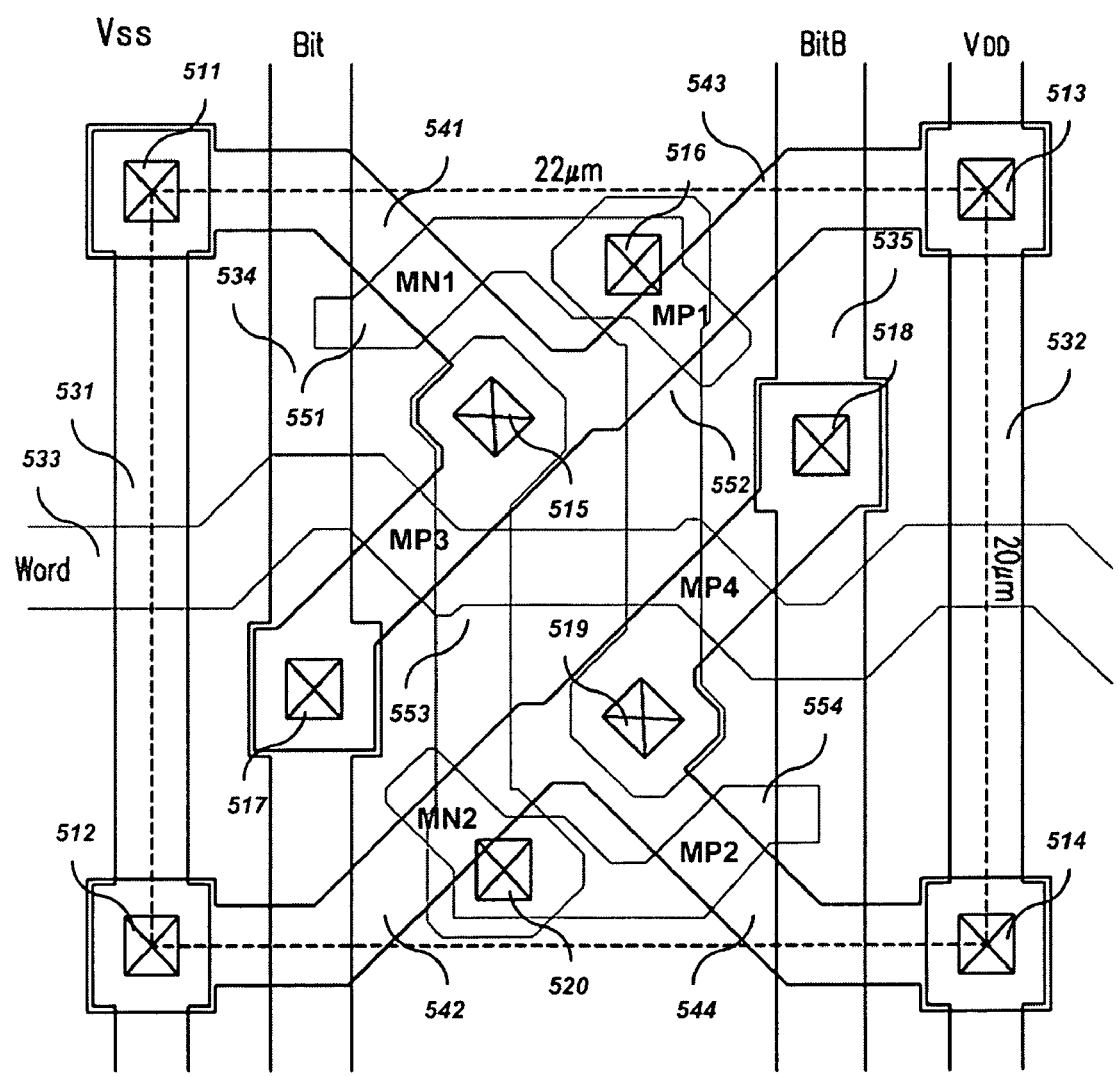
FIG. 5 shows a layout of a CMOS RAM core cell for a light-emitting display according to an embodiment of the present invention.

FIG. 5 shows a layout of a CMOS RAM core cell for light-emitting display according to an embodiment of the present invention.

Referring to FIG. 5, the CMOS RAM core cell for a light-emitting display according to an embodiment of the present invention is a data memory device for the data driver of a light-emitting device that includes six thin film transistors (MP1 to MP4, and MN1 and MN2) each having a gate, a source, and a drain. In the figure, reference numerals 511 to 520 denote contact holes respectively. Also, reference numeral 532 denotes a metal line coupled to a power voltage VDD, reference numeral 531 denotes a metal line coupled to a ground voltage VSS, reference numerals 534 and 535 denote a pair of bit lines, and reference numeral 533 denotes a word line. Also, reference numerals 541 to 544 denote metal lines, and reference numerals 551 to 554 denote poly lines, respectively.

Among the six thin film transistors (MP1 to MP4, and MN1 and MN2), the first switching transistor MP3 has a gate coupled to a word line 533, and a source/drain coupled to the first bit line 534 to select an input to the first bit line 534 according to the input signal of the word line 533.

For example, the word line 533 has a role in a gate poly of the first switching transistor MP3, and a metal line across the contact hole 517 and the contact hole 515 has a role in the source/drain of the first switching transistor MP3. The layouts of the five transistors (MP1, MP2, MP4, MN1 and MN2) are formed in the same manner.

The second switching transistor MP4 has a gate coupled to the word line 533, and a source/drain coupled to a second bit line 535, so as to select an input to the second bit line 535 according to the input signal to the word line 533.

The first to fourth data memory transistors (MP1 and MN1, and MP2 and MN2) that form a flip-flop as described above are coupled to a power voltage (VDD) or a ground voltage (VSS), so as to enable reading or writing of data under the control of the first and second switching transistors MP3 and MP4.

As illustrated in the figure, the channels of the first and second switching transistors MP3 and MP4, or the first to fourth data memory transistors (MP1 and MN1, and MP2 and MN2) are formed in an oblique direction. When the direction of the bit lines is a first direction, and that of the word line is a second direction, the channels of the switching transistors and the data memory transistors are formed in an oblique direction with respect to the first and second directions, respectively. The oblique direction may be a clockwise direction or a counterclockwise direction with respect to the first or second direction. In addition, the first and second switching transistors MP3 and MP4, or the first to fourth data memory transistors (MP1 and MN1, and MP2 and MN2) may be arranged in sequence at the same angle on a defined layout space. As shown in FIG. 5, the channels of the data memory transistors MN1 and MP1 are on one side of the word line 533, and the channels of the data memory transistors MN2 and MP2 are the other side of the word line 533, with respect to the direction of the word line 533.

Figure 6:
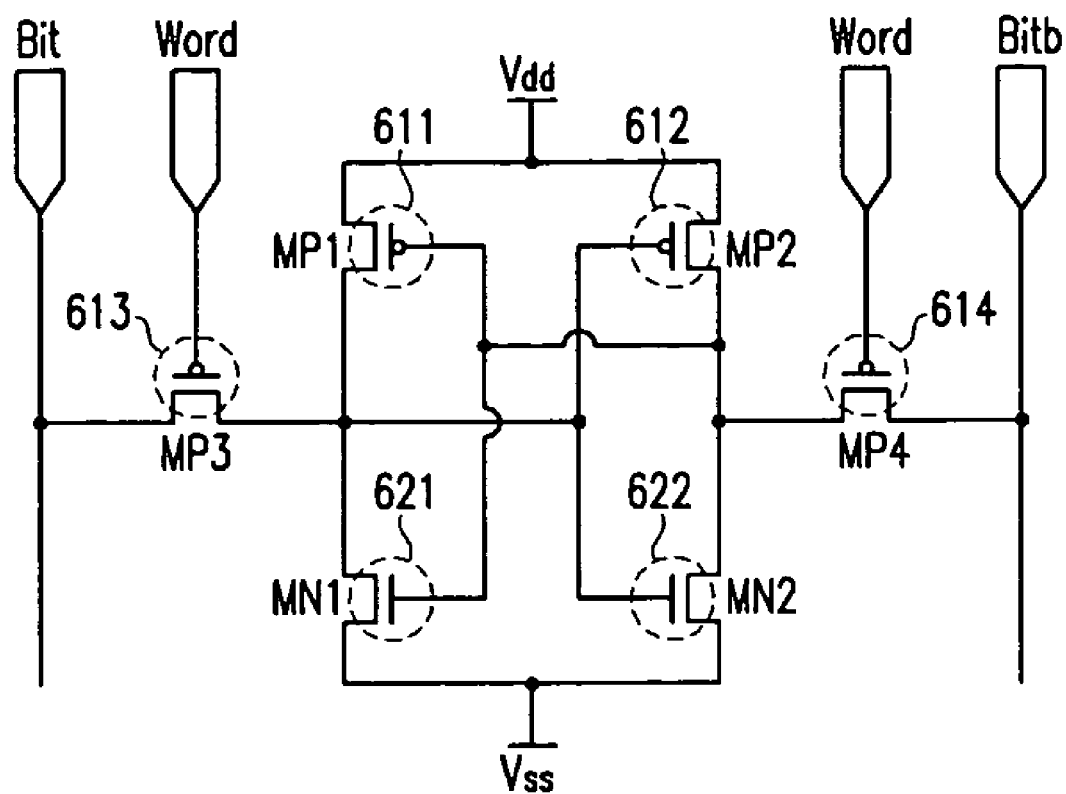
FIG. 6 is a circuit diagram showing the layout part taken in an oblique direction in the CMOS RAM core cell shown in FIG. 5.

FIG. 6 is a circuit diagram showing the layout part taken in an oblique direction in the CMOS RAM core cell of FIG. 5.

The SRAM core cell for a light-emitting display according to an embodiment of the present invention includes a plurality of thin film transistors each having a gate, a source, and a drain. The thin film transistors include four PMOS transistors 611 to 614, and two NMOS transistors 621 and 622, so as to enable writing or reading of data under the control of bit lines and word lines. As described previously, among the six transistors, MP1 and MP2 611 and 612 are pull-up transistors, MN1 and MN2 621 and 622 are pull-down transistors, and MP3 and MP4 613 and 614 are switching transistors for an access. Here, the MP1 to MP4 611 to 614 are PMOS transistors, and the MN1 and MN2 621 and 622 are NMOS transistors. In one embodiment, these transistors are arranged in sequence at an angle of 45° on a defined layout space.

Figure 7:
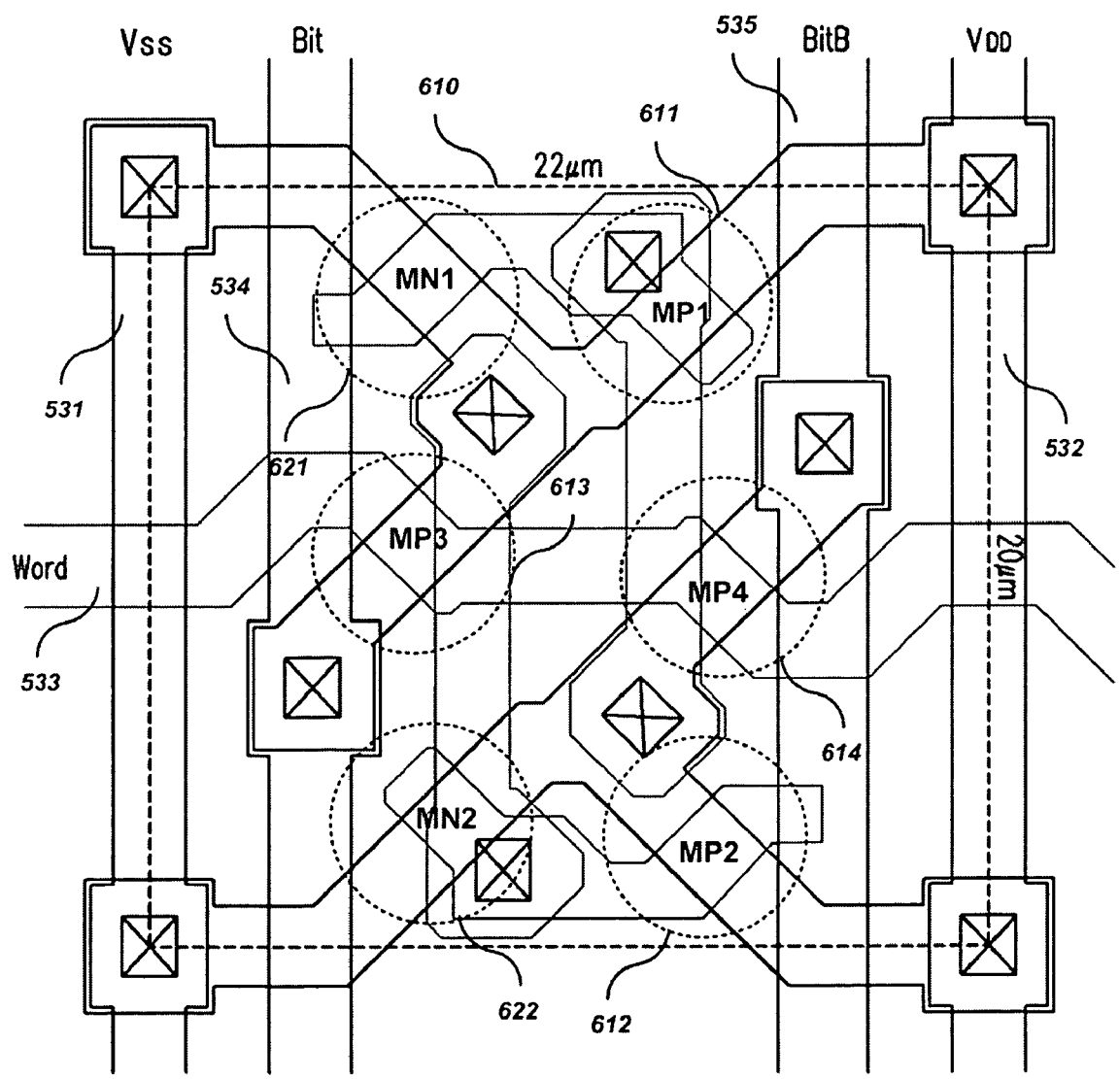
FIG. 7 is a diagram specifically showing the layout taken in an oblique direction in the CMOS RAM core cell according to an embodiment of the present invention in an oblique direction.

FIG. 7 is a diagram specifically showing the layout taken in an oblique direction in the CMOS RAM core cell according to one embodiment of the present invention.

The CMOS SRAM core cell, according to the embodiment of the present invention as shown in FIG. 7, has a defined layout of 22 μm×20 μm (22 μm in width and 20 μm in length) and includes six thin film transistors as stated above.

In the figure, reference numeral 532 denotes a metal line coupled to a power voltage VDD, reference numeral 531 denotes a metal line coupled to a ground voltage VSS, reference numerals 534 and 535 denote a pair of bit lines, and reference numeral 533 denotes a word line.

Referring to FIG. 7, the CMOS RAM core cell includes six transistors, i.e., four PMOS transistors 611 to 614 and two NMOS transistors 621 and 622, and its data write/read is under the control of the bit line pair and the word line. As stated above, the six transistors are arranged in sequence, for example, at an angle of 45° on a defined layout space.

The switching transistors or the data memory transistors arranged in an oblique direction may include a polysilicon layer deposited in an oblique direction on a substrate. Namely, an active region is formed on a polysilicon layer deposited in an oblique direction, and a gate, a source, and a drain are formed in the active region for the above-stated oblique arrangement of the channels.

Furthermore, a semiconductor device having a plurality of transistors formed in an oblique direction on a layout space of a predetermined area can also be implemented according to an embodiment of the present invention. The semiconductor includes a plurality of transistors each having a gate and a source/drain formed on a substrate or on an active region deposited on the substrate. The channels of the transistors on the active region are arranged in an oblique direction on the layout space of a predetermined area. Here, the channels of the transistors formed in an oblique direction on the active region are arranged in sequence and include a polysilicon layer deposited in an oblique direction with respect to the vertical direction on the substrate.

Consequently, the CMOS SRAM core cell for a light-emitting display according to the embodiments of the present invention can have enhanced integration efficiency by forming the channels or the polysilicon layer in an oblique direction.

While this invention has been described in connection with what is presently considered to be the most practical and exemplary embodiment, it is to be understood that the invention is not limited to the disclosed embodiments, but, on the contrary, is intended to cover various modifications and equivalent arrangements included within the spirit and scope of the appended claims.

As described above, the present invention arranges transistors in sequence so as to form a polysilicon layer or channels forming the transistors in an oblique direction in a defined region in designing a SRAM for a data driver of a light-emitting display, thereby enhancing the layout efficiency of the core cell and implementing a light-emitting display device of a high integration level.

What is claimed is:

1. A static RAM (SRAM) core cell for a light-emitting display including a plurality of thin film transistors each having a gate, a source and a drain as a data memory for a data driver of the light-emitting display, the SRAM core cell comprising:

a switching transistor coupled to a bit line and a word line to select writing or reading of data; and a first data memory transistor and a second data memory transistor coupled to a power voltage Vdd, a third data memory transistor and a fourth data memory transistor coupled to a ground voltage Vss, to enable writing or reading of data, wherein the bit line and the word line are in first and second directions, respectively, wherein channels of the switching transistor and the data memory transistors are in an oblique direction with respect to the first and second directions, respectively, wherein the channels of the first data memory transistor and the third data memory transistor are on one side of the word line and the channels of the second data memory transistor and the fourth data memory transistor are on another side of the word line, with respect to the first direction, wherein the first data memory transistor and the second data memory transistor include polysilicon layers deposited in an oblique direction with respect to the first and second directions and the switching transistor includes a polysilicon layer deposited in a same direction with respect to the first direction, and wherein the word line is in an approximately bent shape when crossing the bit line to provide a space for a contact on the bit line from a source/drain of the switching transistor to the bit line, wherein the word line is in an approximately second bent shape when crossing a second bit line adjacent to the bit line to provide a space for a second contact on the second bit line, and wherein the approximately bent shape and the approximately second bent shape are configured in a substantially mirror image with respect to the word line.

2. The SRAM core cell as claimed in claim 1, wherein the oblique direction is one or more of the group consisting of a clockwise direction and a counterclockwise direction, with respect to the first or second direction.

3. The SRAM core cell as claimed in claim 1, wherein the switching transistor or the data memory transistors are arranged in sequence on a defined layout space.

4. A static RAM (SRAM) core cell comprising:
a first thin film switching transistor having a gate coupled to a word line, and a source/drain coupled to a first bit line, to select an input to the first bit line according to an input signal to the word line;
a second thin film switching transistor having a gate coupled to the word line, and a source/drain coupled to a second bit line, to select an input to the second bit line according to an input signal to the word line; and
four thin film data memory transistors coupled to a power voltage or a ground voltage, to enable writing or reading of data under the control of the first and second switching transistors, wherein the bit lines and the word line being formed in first and second directions, respectively,
wherein channels of the first and second switching transistors and the four data memory transistors are in an oblique direction with respect to the first and second directions, respectively,
wherein the channels of first two of the four data memory transistors are on one side of the word line and the channels of second two of the four data memory transistors are on another side of the word line, with respect to the first direction,
wherein some of the four data memory transistors include polysilicon layers deposited in an oblique direction with respect to the first and second directions and at least one of the switching transistor includes a polysilicon layer deposited in a same direction with respect to the first direction,
wherein the word line is in an approximately first bent shape when crossing the first bit line to provide a space for a first contact on the first bit line from the source/drain of the first switching transistor to the first bit line,
wherein the word line is in an approximately second bent shape when crossing the second bit line to provide a space for a second contact on the second bit line from the source/drain of the second switching transistor to the second bit line, and
wherein the approximately first bent shape and the approximately second bent shape are configured in a substantially mirror image with respect to the word line.

5. The SRAM core cell as claimed in claim 4, wherein the first and second switching transistors and the four data memory transistors are arranged in sequence on a layout space of a predetermined area.

6. A semiconductor device comprising:
a substrate; and
a plurality of transistors each having a gate and a source/drain formed on an active region deposited on the substrate,
wherein channels of the transistors formed on the active region being formed in an oblique direction with respect to a layout width or length direction on a layout space of a predetermined area,
wherein the channel of one or two transistors is formed on a word line, the channels of a first half of the remaining transistors are on one side of the word line and the channels of a second half of the remaining transistors are on another side of the word line,
wherein at least one of the transistors includes a polysilicon layers deposited in an oblique direction with respect to the layout width direction and least one of the transistors includes a polysilicon layer deposited in a same direction with respect to the layout width direction,
wherein the word line is in an approximately bent shape when crossing a bit line to accommodate a contact on the bit line from a source/drain of the one of the transistors to the bit line,
wherein the word line is in an approximately second bent shape when crossing a second bit line adjacent to the bit line to provide a space for a second contact on the second bit line, and wherein the approximately bent shape and the approximately second bent shape are configured in a substantially mirror image with respect to the word line.

7. The semiconductor device as claimed in claim 6, wherein the oblique direction is one or more of the group consisting of a clockwise direction and a counterclockwise direction with respect to the layout width or length direction.

8. The semiconductor device as claimed in claim 6, wherein each of the transistors arranged in an oblique direction on the active region include a polysilicon layer deposited in an oblique direction with respect to a vertical direction on the substrate.

9. The semiconductor device as claimed in claim 6, further comprising a line driver and a scan driver for controlling an organic EL panel.

10. The semiconductor device as claimed in claim 6, further comprising a video controller and a panel controller for controlling the line driver and the scan driver.

11. A light emitting display driver comprising:
a static RAM according to claim 4;
an organic EL panel; and
a line driver and a scan driver for controlling the organic EL panel.

12. The light emitting display driver as claimed in claim 11, further comprising a video controller and a panel controller for controlling the line driver and the scan driver.

* * * * *

UNITED STATES PATENT AND TRADEMARK OFFICE
CERTIFICATE OF CORRECTION

| | | |
|---|---|---|
| PATENT NO. | : 7,733,306 B2 | Page 1 of 1 |
| APPLICATION NO. | : 11/132119 | |
| DATED | : June 8, 2010 | |
| INVENTOR(S) | : Han-Hee Yoon | |

It is certified that error appears in the above-identified patent and that said Letters Patent is hereby corrected as shown below:

In the Claims

Column 8, Claim 6, line 20    Delete "being"
    Insert -- are --

Column 8, Claim 6, line 30    Delete "layers"
    Insert -- layer --

Signed and Sealed this
Third Day of April, 2012

David J. Kappos
*Director of the United States Patent and Trademark Office*